United States Patent
Muraki et al.

(10) Patent No.: US 11,361,936 B2
(45) Date of Patent: Jun. 14, 2022

(54) CHARGED PARTICLE BEAM APPARATUS

(71) Applicant: HITACHI HIGH-TECH SCIENCE CORPORATION, Tokyo (JP)

(72) Inventors: Ayana Muraki, Tokyo (JP); Atsushi Uemoto, Tokyo (JP); Tatsuya Asahata, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 17/030,983

(22) Filed: Sep. 24, 2020

(65) Prior Publication Data

US 2021/0090850 A1 Mar. 25, 2021

(30) Foreign Application Priority Data

Sep. 25, 2019 (JP) .............................. JP2019-173888

(51) Int. Cl.
*H01J 37/20* (2006.01)
*H01J 37/32* (2006.01)
*H01J 37/244* (2006.01)

(52) U.S. Cl.
CPC ............ *H01J 37/20* (2013.01); *H01J 37/244* (2013.01); *H01J 37/32788* (2013.01); *H01J 2237/2007* (2013.01); *H01J 2237/31749* (2013.01)

(58) Field of Classification Search
CPC .... H01J 37/20; H01J 37/244; H01J 37/32788; H01J 2237/2007; H01J 2237/31749; H01J 37/304; H01J 37/3023; H01J 2237/208; H01J 2237/30427; H01J 2237/31745; H01J 37/26; H01J 2237/20; H01J 2237/26
See application file for complete search history.

(56) References Cited

U.S. PATENT DOCUMENTS

| 4,885,534 | A  | * | 12/1989 | Eck ..................... | G01R 31/2653 |
|---|---|---|---|---|---|
|  |  |  |  |  | 324/754.22 |
| 10,446,370 | B2 | * | 10/2019 | Suzuki ................. | H01J 37/304 |
| 10,539,540 | B2 | * | 1/2020 | Yamamura ........... | G01N 21/314 |
| 2013/0201316 | A1 | * | 8/2013 | Binder .................... | H04L 67/12 |
|  |  |  |  |  | 348/77 |

(Continued)

FOREIGN PATENT DOCUMENTS

| JP | 2016-157671 A | 9/2016 |
|---|---|---|
| JP | 2019-102138 A | 6/2019 |

*Primary Examiner* — David A Vanore
(74) *Attorney, Agent, or Firm* — Holland & Hart LLP

(57) ABSTRACT

To accomplish fast automated micro-sampling, provided is a charged particle beam apparatus, which is configured to automatically fabricate a sample piece from a sample, the charged particle beam apparatus including: a charged particle beam irradiation optical system configured to radiate a charged particle beam; a sample stage configured to move the sample that is placed on the sample stage; a sample piece transportation unit configured to hold and convey the sample piece separated and extracted from the sample; a holder fixing base configured to hold a sample piece holder to which the sample piece is transported; and a computer configured to perform position control with respect to a second target, based on a machine learning model in which first information including a first image of a first target is learned, and on second information including a second image, which is obtained by irradiation with the charged particle beam.

8 Claims, 16 Drawing Sheets

(56) References Cited

U.S. PATENT DOCUMENTS

| | | | | |
|---|---|---|---|---|
| 2020/0013582 A1* | 1/2020 | Shimizu | ................ | H01J 37/222 |
| 2020/0056141 A1* | 2/2020 | Ikeuchi | .............. | G01N 33/4833 |
| 2020/0243299 A1* | 7/2020 | Wang | .................... | H01J 37/222 |
| 2020/0335300 A1* | 10/2020 | Ito | ......................... | G06T 7/0004 |
| 2021/0043418 A1* | 2/2021 | Abe | ........................ | H01J 37/28 |
| 2021/0043419 A1* | 2/2021 | Nakamura | ............ | H01J 37/265 |
| 2021/0066028 A1* | 3/2021 | Shirasaki | ............... | H01J 37/268 |
| 2021/0090850 A1* | 3/2021 | Muraki | ................ | H01J 37/304 |
| 2021/0090851 A1* | 3/2021 | Muraki | ............... | H01J 37/3045 |
| 2021/0090853 A1* | 3/2021 | Aso | ....................... | H01J 37/265 |
| 2021/0090855 A1* | 3/2021 | Aso | ................... | G01N 23/2251 |
| 2021/0104375 A1* | 4/2021 | Geurts | ................ | H01J 37/3056 |
| 2021/0202205 A1* | 7/2021 | Flanagan | ................ | H01J 37/28 |
| 2021/0313908 A1* | 10/2021 | Van Der Toorn | ...... | H02N 13/00 |

\* cited by examiner

CHARGED PARTICLE BEAM APPARATUS

The present application claims priorities to Japanese Patent Application No. 2019-173888, filed Sep. 25, 2019 and Japanese Patent Application No. 2020-047650, filed Mar. 18, 2020, the entire contents each of which are incorporated herein for all purposes by this reference.

BACKGROUND OF THE INVENTION

1. Field of the Invention

The present invention relates to a charged particle beam apparatus.

2. Description of the Related Art

Hitherto, there has been known an apparatus in which a sample piece fabricated by irradiating a sample with a charged particle beam that is made of electrons or ions is extracted and processed into a shape suitable for observation, analysis, measurement, and other steps that use a transmission electron microscope (TEM) or a similar instrument (Japanese Patent Application Laid-open No. 2019-102138). For observation with a transmission electron microscope, the apparatus described in Japanese Patent Application Laid-open No. 2019-102138 performs so-called micro-sampling (MS) in which a minute thin-film sample piece is extracted from a sample that is an observation target, and fixed to a sample holder to prepare a TEM sample.

A known charged particle beam apparatus uses template matching in the fabrication of a thin sample piece for TEM observation to detect a target, for example, a tip of a microprobe, a pick-up position of the thin sample piece, or a pillar end on a mesh holder (Japanese Patent Application Laid-open No. 2016-157671). In the charged particle beam apparatus described in Japanese Patent Application Laid-open No. 2016-157671, position control is performed with respect to the target based on a template created from an image of the target that is obtained by irradiation with a charged particle beam, and on position information obtained from the image of the target. This enables automatic execution of MS (automated MS) in the charged particle beam apparatus described in Japanese Patent Application Laid-open No. 2016-157671.

In the charged particle beam apparatus described in Japanese Patent Application Laid-open No. 2016-157671, a template image is required to be obtained each time position control of a target is executed, which leads to a drop in the speed of automated MS by the length of time spent to obtain the image. For instance, the shape of a microprobe tip changes due to cleaning, adhesion of a sample, or other factors, and a template image is accordingly obtained each time position control of a target is executed. A template image of a pick-up position of a thin sample piece is obtained before position control as well, because a difference in contrast, focus, or the like lowers the precision of matching. In addition, a user registers, through a mouse operation, the position of the pillar on an image each time because of individual differences with regards to corners of pillars.

In the charged particle beam apparatus described in Japanese Patent Application Laid-open No. 2016-157671, a high definition image, on the other hand, is obtained by slowing the scanning speed in order to improve the rate of success of template matching.

The speed of automated MS has thus been not high enough up to now, and faster automated MS for improved throughput is desired.

SUMMARY OF THE INVENTION

The present invention has been made in view of the above-mentioned circumstances.

The present invention adopts the following embodiments.

(1) According to at least one embodiment of the present invention, there is provided a charged particle beam apparatus, which is configured to automatically fabricate a sample piece from a sample, the charged particle beam apparatus including: a charged particle beam irradiation optical system configured to radiate a charged particle beam; a sample stage configured to move the sample that is placed on the sample stage; a sample piece transportation unit configured to hold and convey the sample piece separated and extracted from the sample; a holder fixing base configured to hold a sample piece holder to which the sample piece is transported; and a computer configured to perform position control with respect to a second target, based on a machine learning model in which first information including a first image of a first target is learned, and on second information including a second image, which is obtained by irradiation with the charged particle beam.

In the charged particle beam apparatus according to the embodiment described in Item (1) above, the position of a target is detectable based on machine learning, and fast automated MS is consequently accomplished. In a charged particle beam apparatus 10, the position of a target is detected based on machine learning, and the time to obtain a template image each time as in the case of using template matching can consequently be cut. Fast automated MS is thus accomplished and the throughput is accordingly improved.

The charged particle beam apparatus can increase the scanning speed at which an image is obtained because machine learning is capable of position detection without requiring an image to be high in definition, whereas a high definition image is obtained in the related art by slowing the scanning speed in order to improve the rate of success of template matching. The speed of automated MS is accordingly increased, with the result that the throughput is improved.

In the charged particle beam apparatus, the creation of a processing recipe is simplified by automating work that has been performed by a user's manual operation in the recipe creation in the related art. The charged particle beam apparatus is also not required to prepare a recipe for each sample, which gives the charged particle beam apparatus a system configuration adaptable to changes in form.

(2) In the charged particle beam apparatus according to Item (1) above, the second target includes a part of a sample table included in the sample piece holder.

In the charged particle beam apparatus according to the embodiment described in Item (2) above, the position of the part of the sample table is detectable based on machine learning, and the step of connecting the sample piece to the part of the sample table in automated MS can therefore be sped up.

(3) In the charged particle beam apparatus according to Item (1) or (2) above, the second target includes a needle to be used in the sample piece transportation unit.

In the charged particle beam apparatus according to the embodiment described in Item (3) above, the position of the tip of the needle is detectable based on machine learning, and the step of moving the needle in automated MS can therefore be sped up.

(4) In the charged particle beam apparatus according to any one of Items (1) to (3) above, the second target includes the sample piece, and the first image is an image indicating a position at which the sample piece transportation unit is to be brought close to the sample piece in a sample extraction step of extracting the sample piece.

In the charged particle beam apparatus according to the embodiment described in Item (4) above, the position at which the sample piece transportation unit is to be brought close to the sample piece in the sample extraction step of extracting the sample piece is detectable based on machine learning, and the step of bringing the needle close to the sample piece in automated MS can therefore be sped up.

(5) In the charged particle beam apparatus according to any one of Items (1) to (4) above, the second target includes the sample piece, and the first image is an image indicating a position at which the sample piece is to be separated and extracted from the sample.

In the charged particle beam apparatus according to the embodiment described in Item (5) above, the position at which the sample piece is to be separated and extracted from the sample is detectable based on machine learning, and the step of connecting the sample piece to the needle in automated MS can therefore be sped up.

(6) In the charged particle beam apparatus according to any one of Items (1) to (5) above, the first image is a pseudo image generated to suit a type of the second target.

In the charged particle beam apparatus according to the embodiment described in Item (6) above, when it is not possible to prepare a sufficient number of images that are obtained by actual irradiation with the charged particle beam as the first image, pseudo images can be used in place of those images, and machine learning in which the first information is learned can therefore be improved in precision.

(7) In the charged particle beam apparatus according to any one of Items (1) to (6) above, the first target and the second target are of the same type.

In the charged particle beam apparatus according to the embodiment described in Item (7) above, the position of a target is detectable based on machine learning in which the first information including the first image of the first target, which is of the same type as the type of the second target, is learned, and the machine learning is therefore improved from a case in which the type of the first target and the type of the second target differ from each other.

According to the present invention, fast automated microsampling is accomplished.

DESCRIPTION OF THE EMBODIMENTS

First Embodiment

Figure 1:
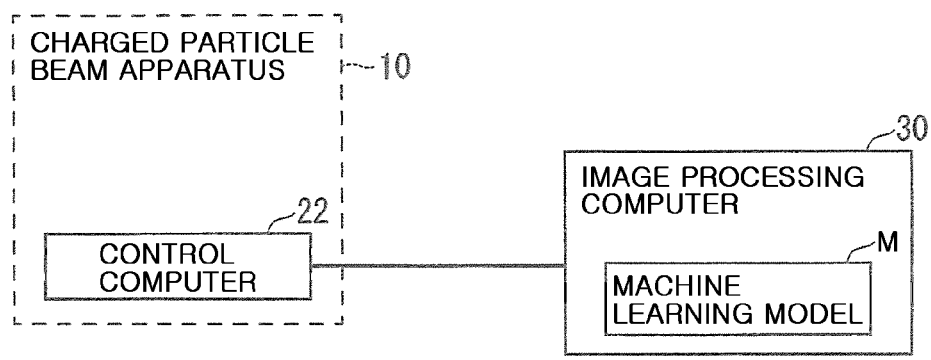
FIG. 1 is a diagram for illustrating an example of a configuration of a charged particle beam apparatus according to a first embodiment of the present invention, and a configuration of an image processing computer in the first embodiment.

Embodiments of the present invention are described below in detail with reference to the drawings. FIG. 1 is a diagram for illustrating an example of a configuration of a charged particle beam apparatus 10 according to a first embodiment of the present invention, and a configuration of an image processing computer 30 in the first embodiment. A control computer 22 included in the charged particle beam apparatus 10 obtains image data obtained by irradiation with a charged particle beam. The control computer 22 transmits or receives data to or from the image processing computer 30. The image processing computer 30 determines, based on a machine learning model M, a target that is included in the image data received from the control computer 22. The control computer 22 performs position control with respect to the target, based on the result of the determination by the image processing computer 30.

The control computer 22 is an example of a computer configured to perform position control with respect to a second target, based on a machine learning model in which first information including a first image of a first target is learned, and on second information including a second image, which is obtained by irradiation with a charged particle beam.

The image processing computer 30 may be included in the charged particle beam apparatus 10.

The configuration of the charged particle beam apparatus 10 is described with reference to FIG. 2.

(Charged Particle Beam Apparatus)

Figure 2:
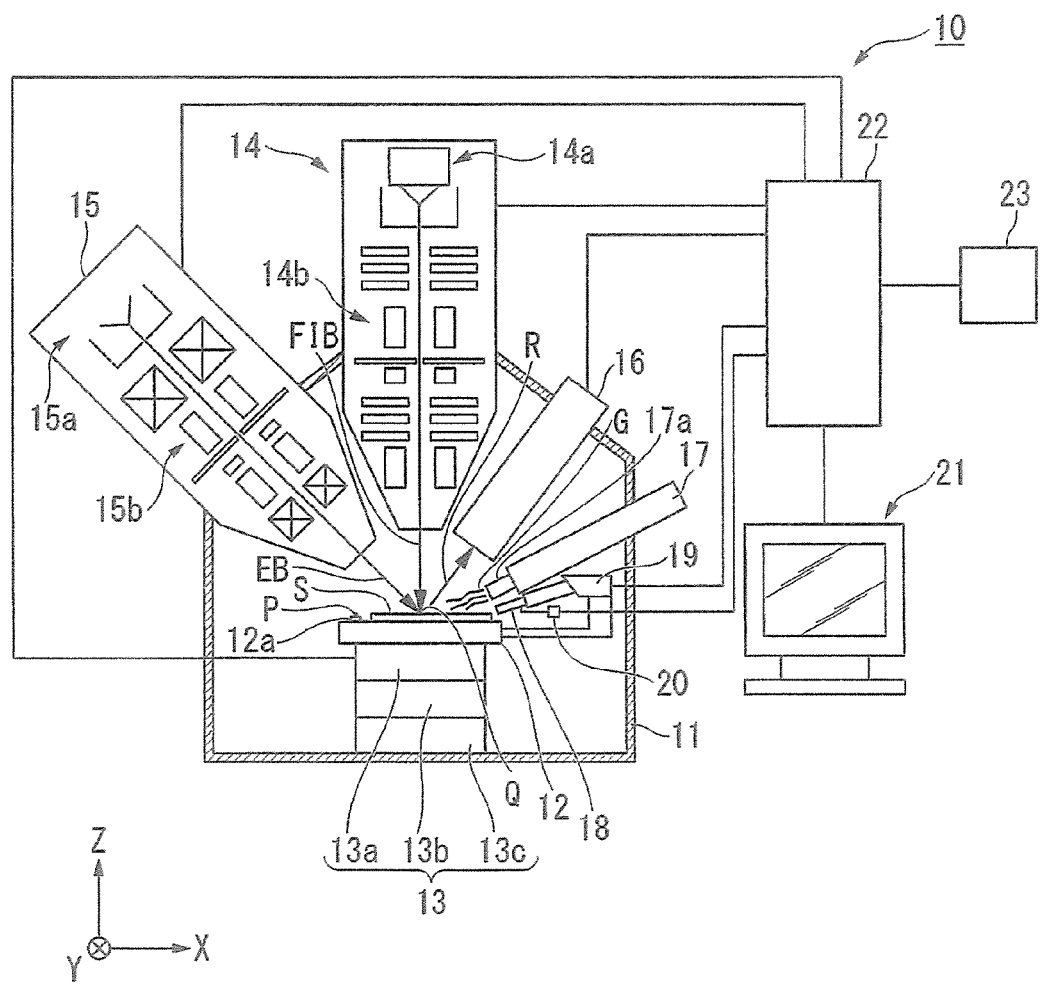
FIG. 2 is a diagram for illustrating an example of the configuration of the charged particle beam apparatus according to the first embodiment of the present invention.

FIG. 2 is a diagram for illustrating an example of the configuration of the charged particle beam apparatus 10 according to the first embodiment. The charged particle beam apparatus 10 includes a sample chamber 11, a sample stage 12, a stage driving mechanism 13, a focused ion beam irradiation optical system 14, an electron beam irradiation optical system 15, a detector 16, a gas supply unit 17, a needle 18, a needle driving mechanism 19, an absorption current detector 20, a display device 21, the control computer 22, and an input device 23.

The interior of the sample chamber 11 is kept in a vacuum state. The sample stage 12 fixes a sample S and a sample piece holder P inside the sample chamber 11. The sample stage 12 includes a holder fixing base 12a configured to hold the sample piece holder P. The holder fixing base 12a may be structured so that a plurality of sample piece holders P can be mounted thereto.

The stage driving mechanism 13 drives the sample stage 12. Here, the stage driving mechanism 13 is contained inside the sample chamber 11 under a state of being connected to the sample stage 12, and is configured to shift the sample stage 12 with respect to a predetermined axis in accordance with a control signal output from the control computer 22. The stage driving mechanism 13 includes a movement mechanism 13a configured to move the sample stage 12 at least along and in parallel to an X axis and a Y axis, which are parallel to a horizontal plane and orthogonal to each other, and a Z axis in a vertical direction, which is orthogonal to the X axis and the Y axis. The stage driving mechanism 13 includes a tilt mechanism 13b configured to tilt the sample stage 12 about the X axis or the Y axis, and a rotation mechanism 13c configured to rotate the sample stage 12 about the Z axis.

The focused ion beam irradiation optical system 14 irradiates an irradiation target within a predetermined irradiation area (namely, scanning range) in the sample chamber 11 with a focused ion beam (FIB). The focused ion beam irradiation optical system 14 irradiates the irradiation target, which includes the sample S placed on the sample stage 12, a sample piece Q, the needle 18 present in the irradiation area, and others, with a focused ion beam from above downward in the vertical direction.

The focused ion beam irradiation optical system 14 includes an ion source 14a configured to generate ions, and an ion optical system 14b configured to focus and deflect the ions extracted from the ion source 14a. The ion source 14a and the ion optical system 14b are controlled in accordance with a control signal output from the control computer 22 such that an irradiation position, irradiation conditions, and the like of the focused ion beam are controlled by the control computer 22.

The electron beam irradiation optical system 15 irradiates the irradiation target within a predetermined irradiation area in the sample chamber 11 with an electron beam (EB). The electron beam irradiation optical system 15 can irradiate the irradiation target, which includes the sample S fixed to the sample stage 12, the sample piece Q, the needle 18 present in the irradiation area, and others, with an electron beam from above downward in a tilt direction with the tilt of a predetermined angle (for example, 60°) with respect to the vertical direction.

The electron beam irradiation optical system 15 includes an electron source 15a configured to generate electrons, and an electron optical system 15b configured to focus and deflect the electrons emitted from the electron source 15a. The electron source 15a and the electron optical system 15b are controlled in accordance with a control signal output from the control computer 22 such that an irradiation position, irradiation conditions, and the like of the electron beam are controlled by the control computer 22.

The arrangement of the electron beam irradiation optical system 15 and the focused ion beam irradiation optical system 14 may be switched so as to arrange the electron beam irradiation optical system 15 in the vertical direction, and arrange the focused ion beam irradiation optical system 14 in the tilt direction with the tilt of a predetermined angle in the vertical direction.

The detector 16 detects secondary charged particles (secondary electrons or secondary ions) R generated from the irradiation target by irradiation with a focused ion beam or an electron beam. The gas supply unit 17 supplies gas G to a surface of the irradiation target. The needle 18 takes the sample piece Q, which is minute, out of the sample S fixed to the sample stage 12, and holds and transports the sample piece Q to the sample piece holder P. The needle driving mechanism 19 drives the needle 18 to convey the sample piece Q. In the following description, the needle 18 and the needle driving mechanism 19 may collectively be referred to as "sample piece transportation unit".

The absorption current detector 20 detects an inflowing current (also called an absorption current) of a charged particle beam that flows into the needle 18, and outputs the result of the detection as an inflowing current signal to the control computer 22.

The control computer 22 controls at least the stage driving mechanism 13, the focused ion beam irradiation optical system 14, the electron beam irradiation optical system 15, the gas supply unit 17, and the needle driving mechanism 19. The control computer 22 is arranged outside the sample chamber 11, and is connected to the display device 21, and the input device 23, for example, a mouse or a keyboard, which is configured to output a signal corresponding to an input operation of an operator. The control computer 22 centrally controls the operation of the charged particle beam apparatus 10 with the signal output from the input device 23, or a signal generated by preset automatic driving control processing, for example.

As described above, the control computer 22 performs position control with respect to a target, based on the result of the determination by the image processing computer 30. The control computer 22 includes a communication interface for communication to and from the image processing computer 30.

The control computer 22 uses the inflowing current signal output from the absorption current detector 20 as absorption current image data to create an image from the signal. Here, the control computer 22 converts the detected amount of the secondary charged particles R, which are detected by the detector 16 during scanning of an irradiation position irradiated with the charged particle beam, into a luminance signal associated with the irradiation position, and generates absorption current image data indicating a shape of the irradiation target by means of a two-dimensional position distribution of the detected amount of the secondary charged particles R. In an absorption current image mode, the control computer 22 generates absorption current image data, which indicates the shape of the needle 18 by means of a two-dimensional position distribution of an absorption current (absorption current image), by detecting an absorption current that flows in the needle 18 during the scanning of the irradiation position irradiated with the charged particle beam. The control computer 22 displays the generated image data on the display device 21.

The display device 21 displays, among others, image data based on the secondary charged particles R, which are detected by the detector 16.

The charged particle beam apparatus 10 can execute visualization of an irradiation target, various types of processing (digging, trimming processing, and the like) through sputtering, the forming of a deposition film, and others by irradiating and scanning a surface of the irradiation target with a focused ion beam.

Figure 3:
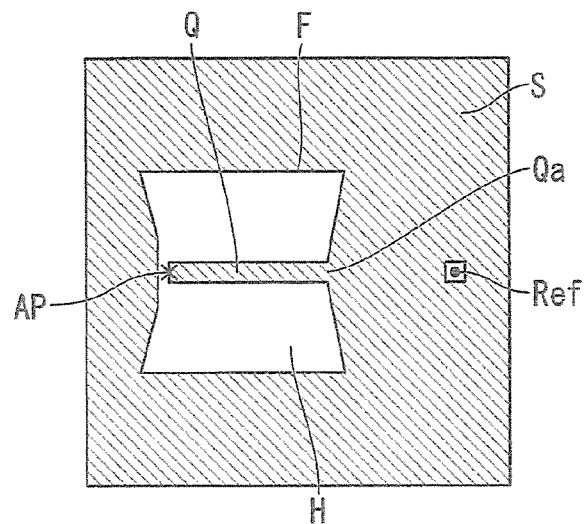
FIG. 3 is a plan view for illustrating a sample piece in the first embodiment of the present invention.

FIG. 3 is a plan view for illustrating the sample piece Q formed by irradiating a surface (hatched part) of the sample S with a focused ion beam in the charged particle beam apparatus 10 according to the first embodiment of the present invention, prior to the extraction of the sample piece Q from the sample S. A reference symbol "F" indicates a frame of processing with a focused ion beam, namely, a scanning range of the focused ion beam. The inside (white part) of the frame is a processed area H created by digging through sputtering processing that is executed by irradiation with the focused ion beam. A reference mark "Ref" represents a reference point indicating a position at which the sample piece Q is to be formed (the position of a part to be left intact in the digging). A rough position of the sample piece Q is found out with the use of the deposition film, and fine positioning of the sample piece Q uses a minute hole. In the sample S, peripheral parts of the sample piece Q are ground and removed on the sides and at the bottom by etching processing, with a support portion Qa, which is connected to the sample S, left intact. The sample piece Q is cantilevered to the sample S by the support portion Qa.

The sample piece holder P is described next with reference to FIG. 4 and FIG. 5.

Figure 4:
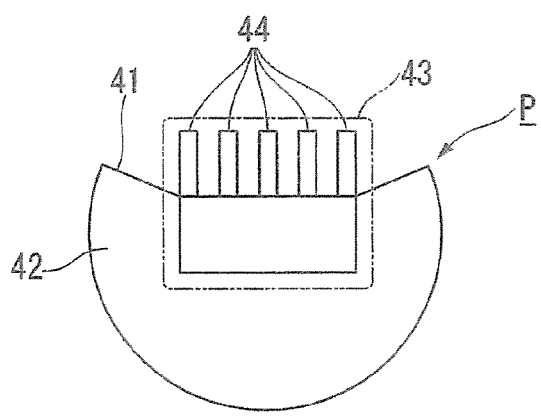
FIG. 4 is a plan view of a sample piece holder in the first embodiment of the present invention.
Figure 5:
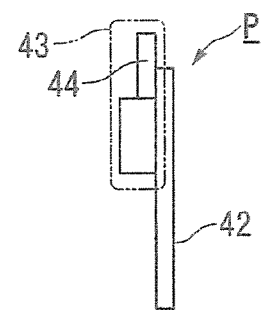
FIG. 5 is a side view of the sample piece holder in the first embodiment of the present invention.

FIG. 4 is a plan view of the sample piece holder P and FIG. 5 is a side view of the sample piece holder P. The sample piece holder P includes a base portion 42, which is a substantially semicircular plate and which has a cutout portion 41, and a sample table 43 fixed to the cutout portion 41. The base portion 42 is formed of, for example, metal having a circular plate shape. The sample table 43 includes a plurality of protruding pillar-like portions (hereinafter also referred to as "pillars") 44, which are spaced apart from one another to have a comb-teeth shape and to which sample pieces Q are to be transported.

(Image Processing Computer)

Figure 6:
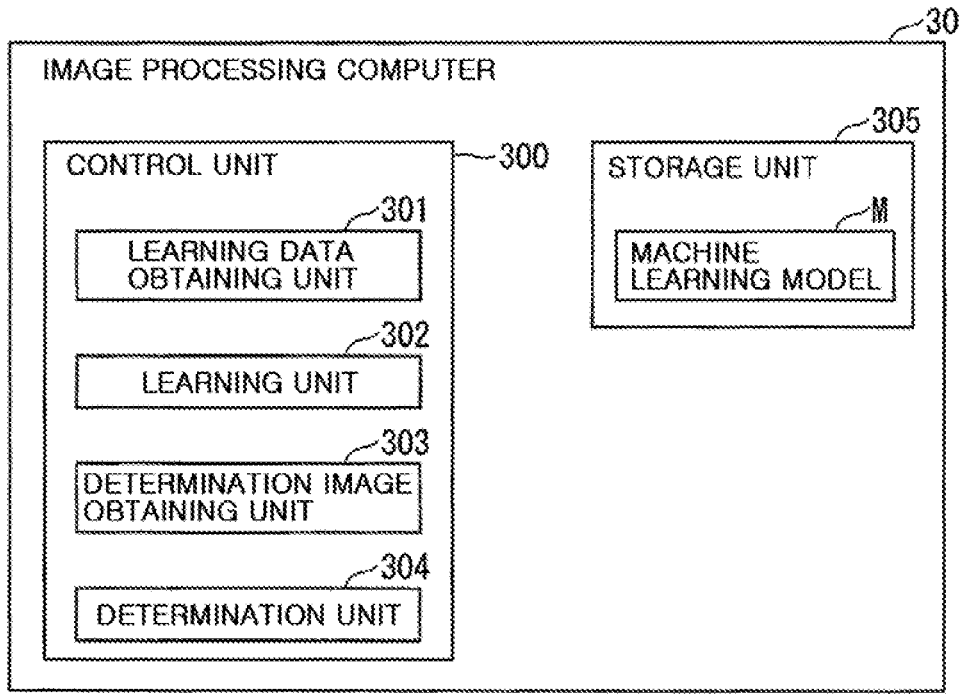
FIG. 6 is a diagram for illustrating an example of the configuration of the image processing computer in the first embodiment of the present invention.

The image processing computer 30 is described next with reference to FIG. 6. FIG. 6 is a diagram for illustrating an example of a configuration of the image processing computer 30 in the first embodiment. The image processing computer 30 includes a control unit 300 and a storage unit 305.

The control unit 300 includes a learning data obtaining unit 301, a learning unit 302, a determination image obtaining unit 303, and a determination unit 304.

The learning data obtaining unit 301 obtains learning data. The learning data is information used for learning in machine learning. The learning data is a combination of a learning image and information indicating the position of a target in the learning image. Examples of the target in the learning image include the sample piece, the needle, and the pillar-like portions included in the sample piece holder. The type of the target in the learning image and the type of a target in a determination image are the same. For instance, when the type of the target in the learning image is sample piece, needle, or pillar-like portion, the type of the target in the determination image is sample piece, needle, or pillar-like portion, respectively.

In the first embodiment, an SIM image and an SEM image obtained in advance by the irradiation of the target with a charged particle beam are used as the learning image. The charged particle beam is radiated onto the target from a predetermined direction. In the charged particle beam apparatus 10, the direction of a lens barrel of each charged particle beam irradiation optical system is fixed, and the direction in which the charged particle beam is radiated onto the target is accordingly predetermined.

An example of the information indicating the position of the target in the learning image is coordinates indicating the position of the target in the learning image. The coordinates indicating the position in the learning image are, for example, two-dimensional orthogonal coordinates or polar coordinates.

The learning image includes both of an SIM image of the target and an SEM image of the target. The learning image is both of an SIM image in which the target is viewed from the tilt direction with the tilt of a predetermined angle with respect to the vertical direction of the sample stage 12 and an SEM image in which the target is viewed from the vertical direction of the sample stage 12. That is, the learning image includes an image of the target viewed from a first direction defined with the sample stage 12 as a reference, and an image of the target viewed from a second direction. The second direction is a direction that is defined with the sample stage 12 as a reference and that is not the first direction.

The learning unit 302 executes machine learning based on the learning data, which is obtained by the learning data obtaining unit 301. The learning unit 302 stores the result of the learning as the machine learning model M in the storage unit 305. The learning unit 302 executes machine learning for each target type of the learning image included in the learning data. The machine learning model M is accordingly generated for each target type of the learning image included in the learning data. The machine learning model M is an example of a model of machine learning in which the first information including the first image of the first target is learned.

In the following description, a target captured by image pickup or drawn in an image may be referred to as "target of the image".

The machine learning executed by the learning unit 302 is deep learning using, for example, a convolutional neural network (CNN). The machine learning model M in this case is a multi-layer neural network in which weighting between nodes is varied depending on association between a learning image and the position of a target in the learning image. The multi-layer neural network includes an input layer in which nodes correspond to pixels of an image and an output layer in which nodes correspond to positions in the image. When the luminance value of each pixel in an SIM image or an SEM image is input to the input layer, a set of values indicating a position in the image is output from the output layer.

The determination image obtaining unit 303 obtains a determination image. The determination image is an SIM image and SEM image output from the control computer 22. The determination image includes the images of the target described above. The target of the determination image includes objects related to irradiation with a charged particle beam, for example, the sample piece Q and the needle 18 after use.

The determination image is both of an SIM image in which the target is viewed from the tilt direction with the tilt of a predetermined angle with respect to the vertical direction of the sample stage 12 and an SEM image in which the target is viewed from the vertical direction of the sample stage 12. That is, the determination image includes an image of the target viewed from the first direction and an image of the target viewed from the second direction. The first direction is a direction defined with the sample stage 12 as a reference, and the second direction is a direction that is defined with the sample stage 12 as a reference and that is not the first direction.

The determination unit 304 determines the position of the target that is included in the determination image obtained by the determination image obtaining unit 303, based on the machine learning model M, which is generated through the execution of learning by the learning unit 302. Examples of the position of the target included in the determination image include a pick-up position of the sample piece in the SIM image or the SEM image, the position of the tip of the needle in the SIM image or the SEM image, and the position of the pillar-like portion 44 in the SIM image or the SEM image. The determination unit 304 determines, for example, the coordinates of the target in the determination image as the position of the target included in the determination image.

The image processing computer 30 may obtain a learned machine learning model from, for example, an external database. In that case, the control unit 300 may not include the learning data obtaining unit 301 and the learning unit 302.

In the following description, the operation of automated micro-sampling (MS) executed by the control computer 22, namely, the operation of automatically transporting the sample piece Q, which has been formed by processing the sample S with a charged particle beam (focused ion beam), to the sample piece holder P, is broken roughly into an initial setting step, a sample piece pick-up step, and a sample piece mounting step, and the steps are described in order.

Figure 7:
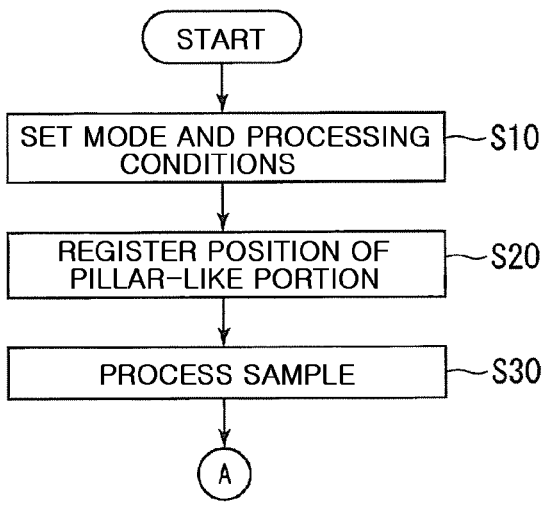
FIG. 7 is a diagram for illustrating an example of an initial setting step in the first embodiment of the present invention.

(Initial Setting Step) FIG. 7 is a diagram for illustrating an example of the initial setting step in the first embodiment.

Step S10: The control computer 22 executes the setting of a mode and processing conditions. The setting of a mode involves setting whether to set a posture control mode, which is described later, based on an operator's input at the start of an automation sequence. The setting of processing conditions involves setting the processing position, dimensions, the number of sample pieces Q, and the like.

Step S20: The control computer 22 registers the position of the pillar-like portion 44. The control computer 22 at this point transmits an SIM image and an SEM image that include the pillar-like portion 44 as the target to the image processing computer 30.

In the first embodiment, the absorption current image data including a target is a combination of an SIM image of the target and an SEM image of the target. That is, the SIM image and the SEM image that include the target are a combination of an SIM image in which the target is viewed from the tilt direction with the tilt of a predetermined angle with respect to the vertical direction of the sample stage 12 and an SEM image in which the target is viewed from the vertical direction of the sample stage 12.

The determination image obtaining unit 303 obtains the SIM image and the SEM image as the determination image from the image processing computer 30. The determination unit 304 determines, based on the machine learning model M, the position of the pillar-like portion 44 that is included in the determination image obtained by the determination image obtaining unit 303. The determination unit 304 outputs position information indicating the determined position of the pillar-like portion 44 to the control computer 22.

The determination unit 304 determines the two-dimensional coordinates of the position of the target on the sample stage 12 from the SIM image in which the target is viewed from the tilt direction with the tilt of a predetermined angle with respect to the vertical direction of the sample stage 12. The determination unit 304 uses an SEM image in which the target is viewed from the tilt direction with the tilt of a predetermined angle with respect to the vertical direction of the sample stage 12 as well to determine two-dimensional coordinates of the position of the target on a plane perpendicular to the tilt direction. The determination unit 304 determines the position of the target in the form of values of three-dimensional coordinates, based on the determined two-dimensional coordinates on the sample stage 12 and the determined two-dimensional coordinates on the plane perpendicular to the tilt direction.

The determination unit 304 calculates the values of the three-dimensional coordinates with the use of direction information, which is information about directions in which the electron beam irradiation optical system 15 and the focused ion beam irradiation optical system 14 are arranged in the charged particle beam apparatus 10, and about an angle between the two optical systems. The determination unit 304 reads the direction information stored in advance in the storage unit 305, or obtains the direction information from the control computer 22.

In Step S20, the target is the pillar-like portion 44. The determination unit 304 executes the same processing as the one in this step to determine the position of a target in the following steps.

The pillar-like portions 44 and learning images of the pillar-like portions 44 to be used in the generation of the machine learning model M are described with reference to FIG. 8 to FIG. 12.

Figure 8:
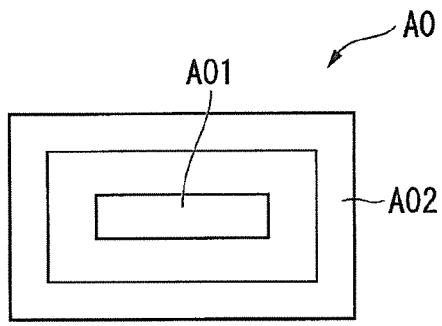
FIG. 8 is a top view of a pillar-like portion in the first embodiment of the present invention.
Figure 9:
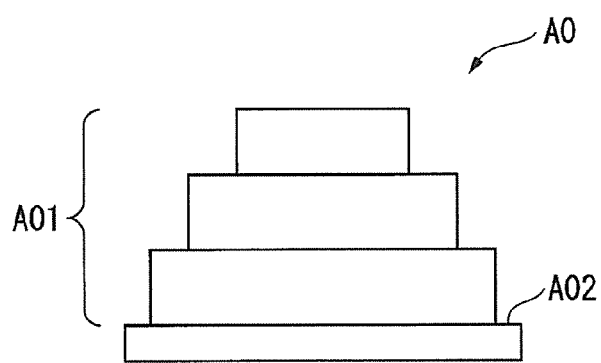
FIG. 9 is a side view of the pillar-like portion in the first embodiment of the present invention.

FIG. 8 and FIG. 9 are views for illustrating an example of the pillar-like portions 44 in the first embodiment. A pillar-like portion AO illustrated in FIG. 8 and FIG. 9 is an example of the design structure of the pillar-like portions 44. FIG. 8 is a top view of the pillar-like portion AO, and FIG. 9 is a side view of the pillar-like portion AO. The pillar-like portion AO has a structure in which a pillar A01 having a tiered structure is adhered to a base portion A02.

Figure 10:
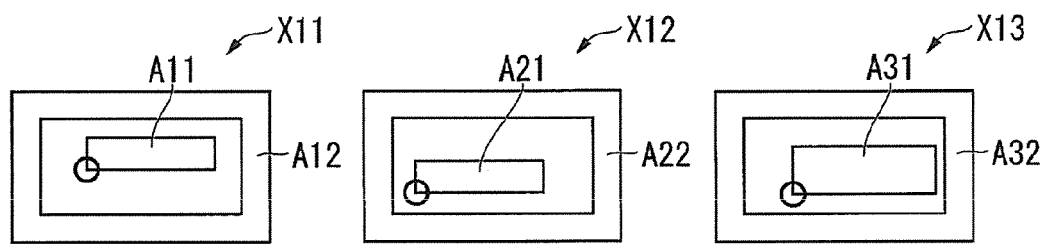
FIG. 10 is a diagram for illustrating an example of learning images of the pillar-like portions in the first embodiment of the present invention.

FIG. 10 is a diagram for illustrating an example of learning images of the pillar-like portions 44 in the first embodiment. A learning image X11, a learning image X12, and a learning image X13 are used for the learning of the positions of the pillar-like portions 44. In the learning image X11, the learning image X12, and the learning image X13, information indicating the position of a pillar-like portion is illustrated as a circle.

A pillar A11 in the learning image X11, a pillar A21 in the learning image X12, and a pillar A31 in the learning image X13 differ in shape from one another. A base portion A12 in the learning image X11, a base portion A22 in the learning image X12, and a base portion A32 in the learning image X13, on the other hand, have the same shape.

The learning image X11, the learning image X12, and the learning image X13 are learning images for determining, as an example, the positions of the pillar-like portions 44 that are included in the SIM image and the SEM image when the pillar-like portions 44 are viewed from a horizontal direction of the sample stage 12. Although the focused ion beam irradiation optical system 14 and the electron beam irradiation optical system 15 in FIG. 2 do not face the sample stage 12 from the horizontal direction of the sample stage 12, one of the focused ion beam irradiation optical system 14 and the electron beam irradiation optical system 15 may face the sample stage 12 from the horizontal direction, and the learning image X11, the learning image X12, and the learning image X13 are learning images for determining the positions of the pillar-like portions 44 in that case.

Figure 11:
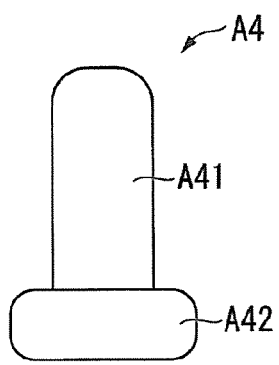
FIG. 11 is a view for illustrating an example of the pillar-like portion in the first embodiment of the present invention, in which a pillar does not have a tiered structure.

FIG. 11 is a view for illustrating an example of the pillar-like portions 44 in the first embodiment, in which a pillar does not have a tiered structure. A pillar-like portion A4 illustrated in FIG. 11 is an example of the design structure of the pillar-like portions 44 that does not give a pillar a tiered structure, and is viewed from the side.

Figure 12:
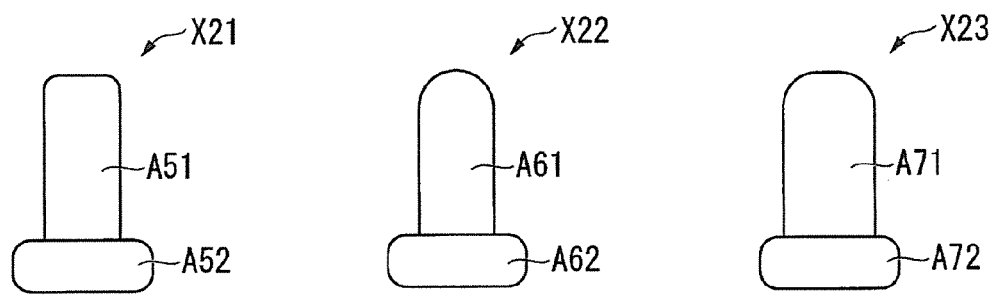
FIG. 12 is a diagram for illustrating an example of learning images of the pillar-like portions in the first embodiment of the present invention, in which the pillar does not have a tiered structure.

FIG. 12 is a diagram for illustrating an example of learning images of the pillar-like portions 44 in the first embodiment, in which a pillar does not have a tiered structure. A learning image X21, a learning image X22, and a learning image X23 are learning images for determining, as an example, the positions of the pillar-like portions 44 that are included in the SEM image when the pillar-like portions 44 are viewed from the vertical direction of the sample stage 12.

A pillar A51 in the learning image X21, a pillar A61 in the learning image X22, and a pillar A71 in the learning image X23 differ in shape from one another. A base portion A52 in the learning image X21, a base portion A62 in the learning image X22, and a base portion A72 in the learning image X23, on the other hand, have the same shape.

In the template matching of the related art, a difference in pillar shape results in unsuccessful determination of the position of a pillar-like portion in some cases. In the machine learning model M, on the other hand, base portion shapes, for example, are learned as a feature amount because the machine learning model M is generated based on machine learning that uses learning images including the base portions of the pillar-like portions 44. The charged particle beam apparatus 10 is therefore improved in the precision of the determination of the pillar-like portions even when there is a difference in pillar shape.

A target object of a learning image is preferred to be designed so that target objects of a plurality of learning images include parts that are the same in shape in one target object and another target object.

Referring back to FIG. 7, the description of the initial setting step is continued.

The control computer 22 registers the position of the pillar-like portion 44 based on the position information indicating the position of the pillar-like portion 44 that has been determined by the image processing computer 30.

Learning images of the pillar-like portions 44 are preferred to include images of two of the pillar-like portions 44 that are located at both ends of the sample table 43. The image processing computer 30 detects the two of the pillar-like portions 44 that are at both the ends of the sample table 43 separately from the other pillar-like portions 44, based on the machine learning model M that is generated with the use of the learning data that includes those learning images. The control computer 22 may calculate a tilt of the sample piece holder P from the positions of the detected pillar-like portions at the ends. The control computer 22 may correct the coordinate values of the position of the target based on the calculated tilt.

Step S30: The control computer 22 controls the focused ion beam irradiation optical system 14 to process the sample S.

Figure 13:
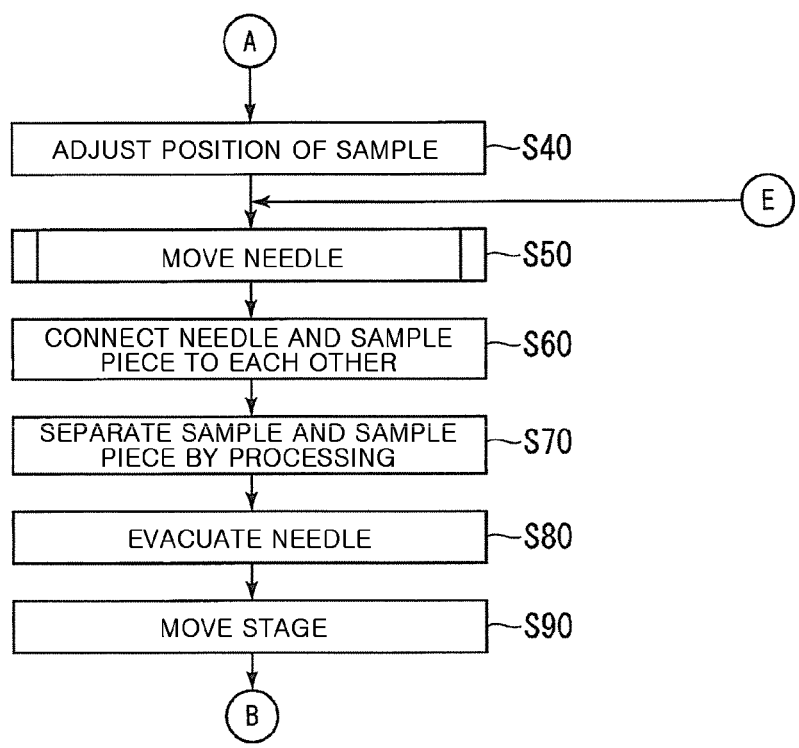
FIG. 13 is a diagram for illustrating an example of a sample piece pick-up step in the first embodiment of the present invention.

(Sample Piece Pick-up Step) FIG. 13 is a diagram for illustrating an example of the sample piece pick-up step in the first embodiment. The term "pick-up" used herein refers to the separation and extraction of the sample piece Q from the sample S by processing with a focused ion beam, and by the needle.

Step S40: The control computer 22 adjusts the position of the sample. The control computer 22 uses the stage driving mechanism 13 to move the sample stage 12 so that the sample piece Q that is a target enters a viewing field covered by a charged particle beam. For the moving, the control computer 22 uses a relative position relationship between the reference mark Ref and the sample piece Q. The control computer 22 executes the positioning of the sample piece Q after the sample stage 12 is moved.

Step S50: The control computer 22 executes the moving of the needle 18.

Figure 14:
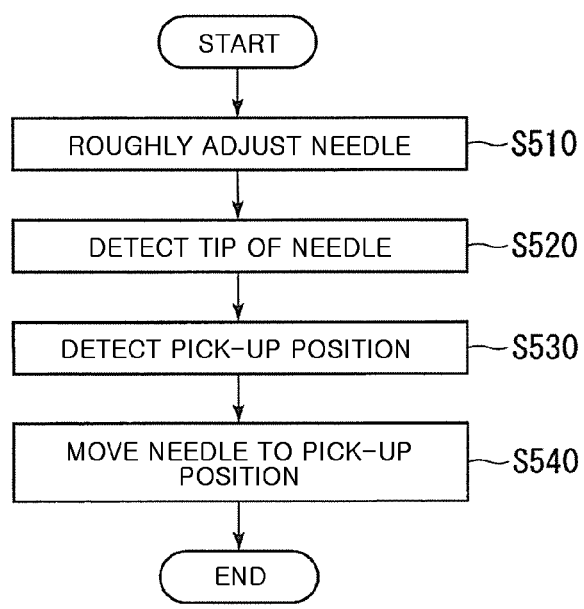
FIG. 14 is a diagram for illustrating an example of processing of moving a needle in the first embodiment of the present invention.

Processing for the moving of the needle 18 executed by the control computer 22 is described with reference to FIG. 14. FIG. 14 is a diagram for illustrating an example of processing of moving the needle 18 in the first embodiment. Step S510 to Step S540 of FIG. 14 correspond to Step S50 of FIG. 13.

Step S510: The control computer 22 executes needle moving (rough adjustment) in which the needle 18 is moved by the needle driving mechanism 19.

Step S520: The control computer 22 detects the tip of the needle 18. The control computer 22 transmits the absorption current image data that includes the needle 18 as a target to the image processing computer 30.

The determination image obtaining unit 303 obtains an SIM image and an SEM image from the image processing computer 30 as a determination image. The determination unit 304 determines, as the position of the target, the position of the needle 18 that is included in the determination image obtained by the determination image obtaining unit 303, based on the machine learning model M. The determination unit 304 outputs the position information that indicates the determined position of the needle 18 to the control computer 22.

The control computer 22 next executes needle moving (fine adjustment) in which the needle 18 is moved by the needle driving mechanism 19, based on the position information that indicates the position of the needle 18 determined by the image processing computer 30.

The needle 18 and learning images of the needle 18 to be used in the generation of the machine learning model M are described with reference to FIG. 15 to FIG. 18.

Figure 15:
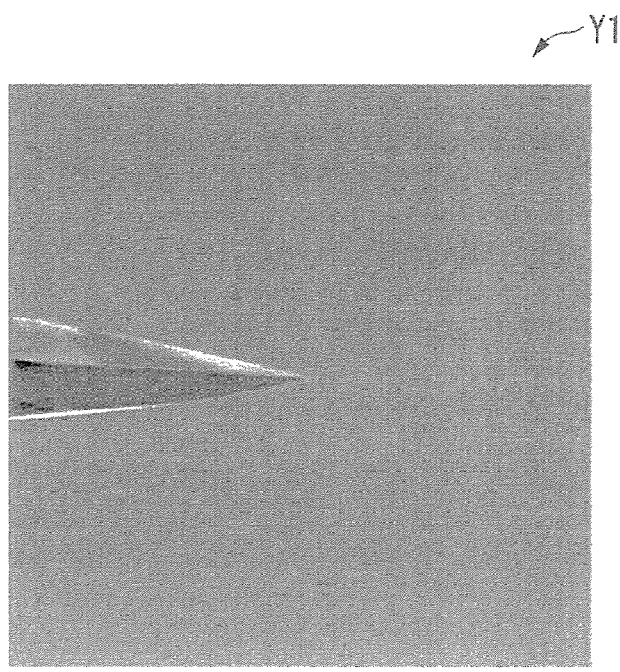
FIG. 15 is a diagram for illustrating an example of SEM image data that includes the tip of the needle in the first embodiment of the present invention.
Figure 16:
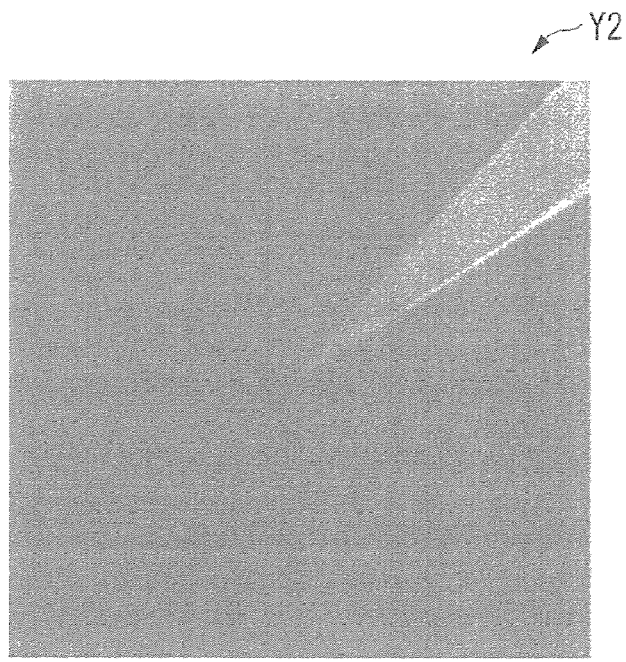
FIG. 16 is a diagram for illustrating an example of SIM image data that includes the tip of the needle in the first embodiment of the present invention.

FIG. 15 is a diagram for illustrating an example of SEM image data that includes the tip of the needle 18 in the first embodiment. FIG. 16 is a diagram for illustrating an example of SIM image data that includes the tip of the needle 18 in the first embodiment.

Figure 17:
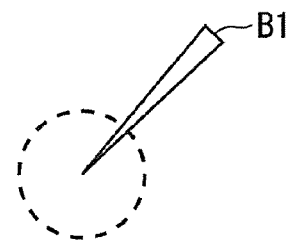
FIG. 17 is a view for illustrating an example of the tip of the needle in the first embodiment of the present invention.

FIG. 17 is a view for illustrating an example of the tip of the needle 18 in the first embodiment. In FIG. 17, a needle B1 viewed from a tilt direction with the tilt of a predetermined angle with respect to the vertical direction of the sample stage 12 is illustrated as an example of the needle 18.

Figure 18:
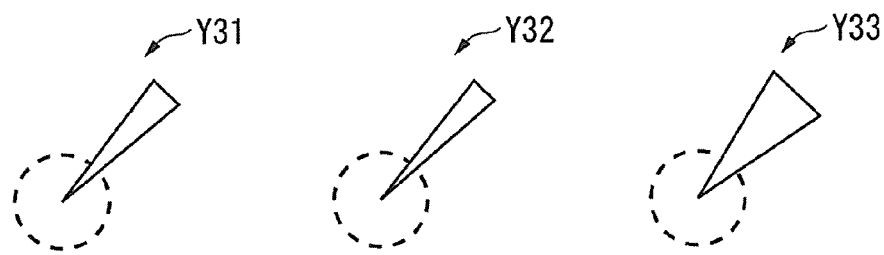
FIG. 18 is a diagram for illustrating an example of learning images of the needle in the first embodiment of the present invention.

FIG. 18 is a diagram for illustrating an example of learning images of the needle 18 in the first embodiment. A learning image Y31, a learning image Y32, and a learning image Y33 are used for the learning of the position of the tip of the needle 18. In the learning image Y31, the learning image Y32, and the learning image Y33, information indicating the position of the tip of the needle 18 is illustrated as a circle. The thickness of the tip of the needle varies in the learning image Y31, the learning image Y32, and the learning image Y33. The shape of the tip of the needle, on the other hand, is the same in the learning image Y31, the learning image Y32, and the learning image Y33.

The actual thickness of the tip of the needle 18 is changed by cleaning. In the template matching of the related art, a difference in the thickness of the tip of the needle results in unsuccessful determination of the position of the tip of the needle in some cases. In the machine learning model M, on the other hand, needle tip shapes, for example, are learned as a feature amount because the machine learning model M is generated based on machine learning that uses learning images including the tip of the needle 18. The charged particle beam apparatus 10 is therefore improved in the precision of the determination of the tip of the needle even when there is a difference in needle tip thickness.

Referring back to FIG. 14, the description of the processing of moving the needle 18 is continued.

Step S530: The control computer 22 detects the pick-up position of the sample piece Q. The control computer 22 transmits an SIM image and an SEM image that include the sample piece Q as a target to the image processing computer 30.

The sample piece Q and learning images of the sample piece Q to be used in the generation of the machine learning model M are described with reference to FIG. 19 and FIG. 20.

Figure 19:
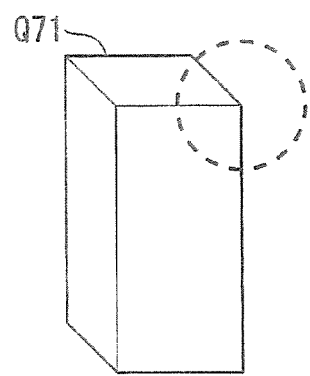
FIG. 19 is a diagram for illustrating an example of SIM image data that includes a sample piece in the first embodiment of the present invention.

FIG. 19 is a diagram for illustrating an example of SIM image data that includes the sample piece Q in the first embodiment. In FIG. 19, a sample piece Q71 is illustrated as an example of the sample piece Q, along with a circle indicating the pick-up position.

Figure 20:
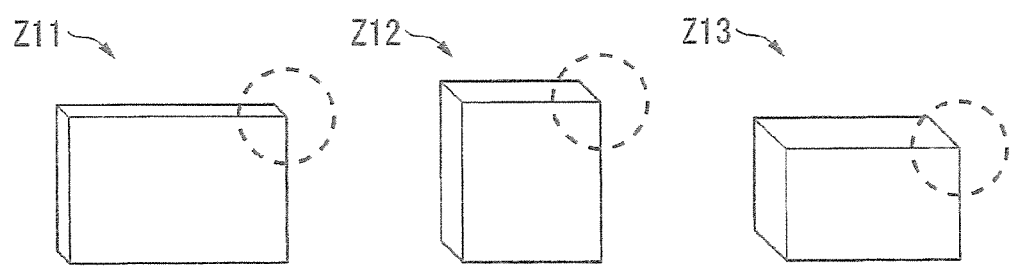
FIG. 20 is a diagram for illustrating an example of learning images of the sample piece in the first embodiment of the present invention.

FIG. 20 is a diagram for illustrating an example of learning images of the sample piece Q in the first embodiment. A learning image Z11, a learning image Z12, and a learning image Z13 are used for the learning of the pick-up position of the sample piece Q. In the learning image Z11, the learning image Z12, and the learning image Z13, information indicating the pick-up position of the sample piece Q is illustrated as a circle. The size and surface shape of the sample piece vary in the learning image Z11, the learning image Z12, and the learning image Z13. The shape of the sample piece at the pick-up position, on the other hand, is the same in the learning image Z11, the learning image Z12, and the learning image Z13.

An actual surface shape of a sample piece varies from one sample piece to another. In the template matching of the related art, a difference in the surface shape of the sample piece results in unsuccessful determination of the pick-up position of the sample piece in some cases. The template matching of the related art may also fail when the contrast or the focus differs between an image of the sample piece and a template, resulting in unsuccessful determination of the pick-up position of the sample piece.

In the machine learning model M, on the other hand, shapes of the sample piece Q at the pick-up position, for example, are learned as a feature amount because the machine learning model M is generated based on machine learning that uses learning images including the pick-up position of the sample piece Q. The charged particle beam apparatus 10 is therefore improved in the precision of the determination of the pick-up position of the sample piece Q even when there is a difference in the surface shape of the sample piece.

Referring back to FIG. 14, the description of the processing of moving the needle 18 is continued.

Step S540: The control computer 22 moves the needle 18 to the detected pick-up position.

With the completion of the steps described above, the control computer 22 ends the processing of moving the needle 18.

Referring back to FIG. 13, the description of the sample piece pick-up step is continued.

Step S60: The control computer 22 connects the needle 18 and the sample piece Q. The control computer 22 uses a deposition film for the connection.

Figure 21:
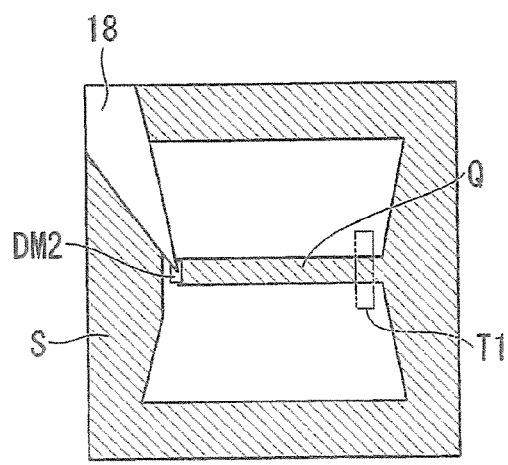
FIG. 21 is a diagram for illustrating a cutting processing position at which a sample and a support portion of a sample piece are cut in SIM image data in the first embodiment of the present invention.

Step S70: The control computer 22 separates the sample S and the sample piece Q by processing. FIG. 21 is an illustration of how the separation by processing is performed, and is a diagram for illustrating a cutting processing position T1 at which the sample S and the support portion Qa of the sample piece Q are cut in SIM image data in the first embodiment of the present invention.

In the first embodiment, the sample piece pick-up step and the sample piece mounting step may be performed also on a sample piece Q0, which has separately been fabricated and processed in advance. In this case, the cutting processing position T1 of FIG. 21 may be determined through machine learning after the positions of the sample piece transportation unit (needle 18) and the sample piece Q0 are adjusted by inputting a specified pick-up position of the sample piece Q0 to the control computer 22. The machine learning in this case uses, as the first image, an image indicating a position at which the sample piece transportation unit is to be brought close to the sample piece (cutting processing position) in the sample extraction step of extracting the sample piece.

The sample piece Q0 can be extracted and separated in this case without inputting processing size/shape information of the sample piece Q0, which indicates the processing size and shape, to the control computer 22. After the sample piece Q0 is extracted, the subsequent sample piece mounting step may be executed in the same manner.

Step S80: The control computer 22 evacuates the needle 18. The control computer 22 detects the position of the tip of the needle 18 in the same manner as in the processing of moving the needle 18 of Step S50, to move and evacuate the needle 18.

Step S90: The control computer 22 moves the sample stage 12. The control computer 22 controls the stage driving mechanism 13 to move the sample stage 12 so that the specific pillar-like portion 44, which has been registered in Step S20 described above, enters an observation field area covered by a charged particle beam.

(Sample Piece Mounting Step)

Figure 22:
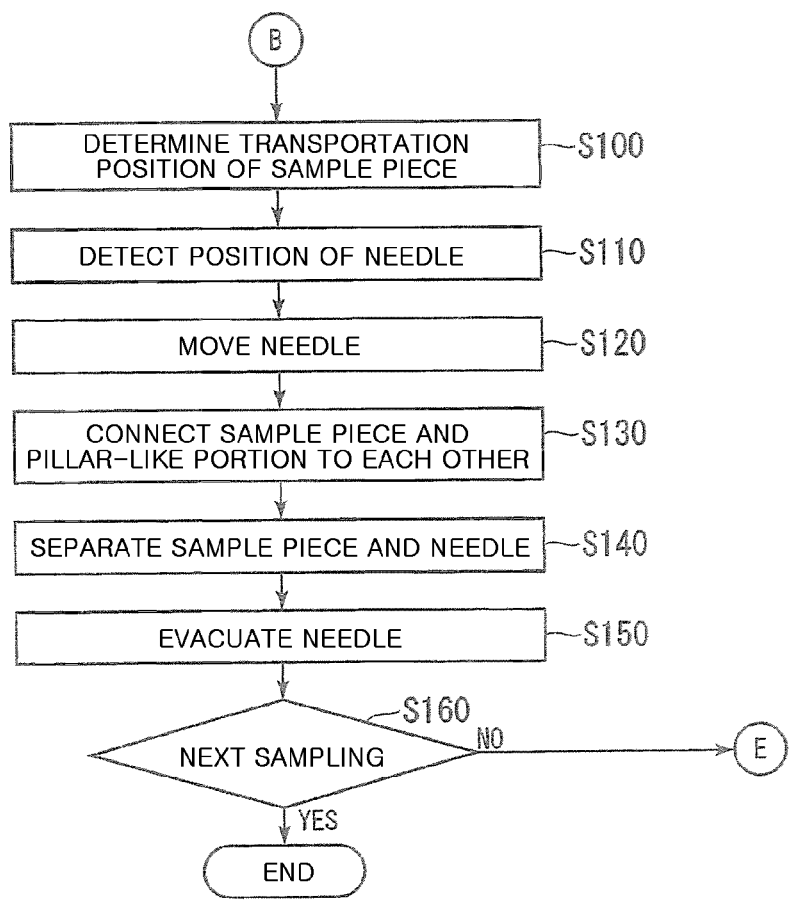
FIG. 22 is a diagram for illustrating an example of a sample piece mounting step in the first embodiment of the present invention.

FIG. 22 is a diagram for illustrating an example of the sample piece mounting step in the first embodiment. The sample piece mounting step is a step of transporting the extracted sample piece Q to the sample piece holder P.

Step S100: The control computer 22 determines a transportation position of the sample piece Q. The control computer 22 determines, as the transportation position, the specific pillar-like portion 44 registered in Step S20 described above.

Step S110: The control computer 22 detects the position of the needle 18. The control computer 22 detects the position of the tip of the needle 18 in the same manner as in Step S520 described above.

Step S120: The control computer 22 moves the needle 18. The control computer 22 uses the needle driving mechanism 19 to move the needle 18 to the transportation position of the sample Q that has been determined in Step S100. The control computer 22 stops the needle 18 with a predetermined gap secured between the pillar-like portion 44 and the sample piece Q.

Step S130: The control computer 22 connects, to the pillar-like portion 44, the sample piece Q connected to the needle 18.

Step S140: The control computer 22 separates the needle 18 and the sample piece Q.

The control computer 22 executes the separation by cutting a deposition film DM2, which connects the needle 18 and the sample piece Q.

Step S150: The control computer 22 evacuates the needle 18. The control computer 22 uses the needle driving mechanism 19 to move the needle 18 away from the sample piece Q by a predetermined distance.

Step S160: The control computer 22 determines whether to execute next sampling. The execution of the next sampling is to continue the sampling of the same sample S from a different site. The number of pieces to be sampled is set in advance in the registration of Step S10, and the control computer 22 checks this data to determine whether to execute the next sampling. When it is determined that the next sampling is to be executed, the control computer 22 returns to Step S50 to continue the subsequent steps in the manner described above, to thereby execute the sampling work. When it is determined that the next sampling is not to be executed, on the other hand, the control computer 22 ends the flow of the series of steps of automated MS.

In the first embodiment, an example of a case in which the learning data is a combination of a learning image and information indicating the position of a target in the learning image is described. The learning data, however, is not limited thereto. The learning data may include, other than a learning image, parameter information, which is information indicating the type of a sample, scanning parameters (acceleration voltages and the like of the focused ion beam irradiation optical system 14 and the electron beam irradiation optical system 15), the number of times the needle 18 is used after the execution of the cleaning of the needle 18, whether a foreign material is adhering to the tip of the needle 18, and the like.

In that case, a machine learning model M1 is generated by executing machine learning based on the learning image and the parameter information. The determination unit 304 obtains the parameter information from the control computer 22 in addition to image data of an SIM image and an SEM image, to thereby determine the position of the target in the image based on the image data, the parameter information, and the machine learning model M1.

The parameter information may further include the direction information described above. When the learning data includes the direction information, the machine learning model M1 is generated by learning the relationship between a target and a direction in which the target is viewed (direction defined with the sample stage 12 as a reference), and the determination unit 304 is therefore not required to use the direction information in the determination of the position of the target.

As described above, the computer (in the first embodiment, the control computer 22) performs position control with respect to a second target (in the first embodiment, the pillar-like portions 44, the needle 18, and the sample piece Q), based on the result of position determination in which the image processing computer 30 determines the position of the second target (in the first embodiment, the pillar-like portions 44, the needle 18, and the sample piece Q) based on a machine learning model (in the first embodiment, the machine learning model M1) and on the second information including the second image (in the first embodiment, SIM images and SEM images of the pillar-like portions 44, the needle 18, and the sample piece Q). The image processing computer 30 and the control computer 22 may be integrated into one to be included in the charged particle beam apparatus 10.

Second Embodiment

A second embodiment of the present invention is described below in detail with reference to the drawings.

In the second embodiment, a description is given on a case in which a pseudo image generated to suit the type of a target is used as a learning image, and a machine learning model to be used is selected based on the type of the target.

The charged particle beam apparatus 10 according to the second embodiment is referred to as "charged particle beam apparatus 10a", and the image processing computer 30 in the second embodiment is referred to as "image processing computer 30a".

Figure 23:
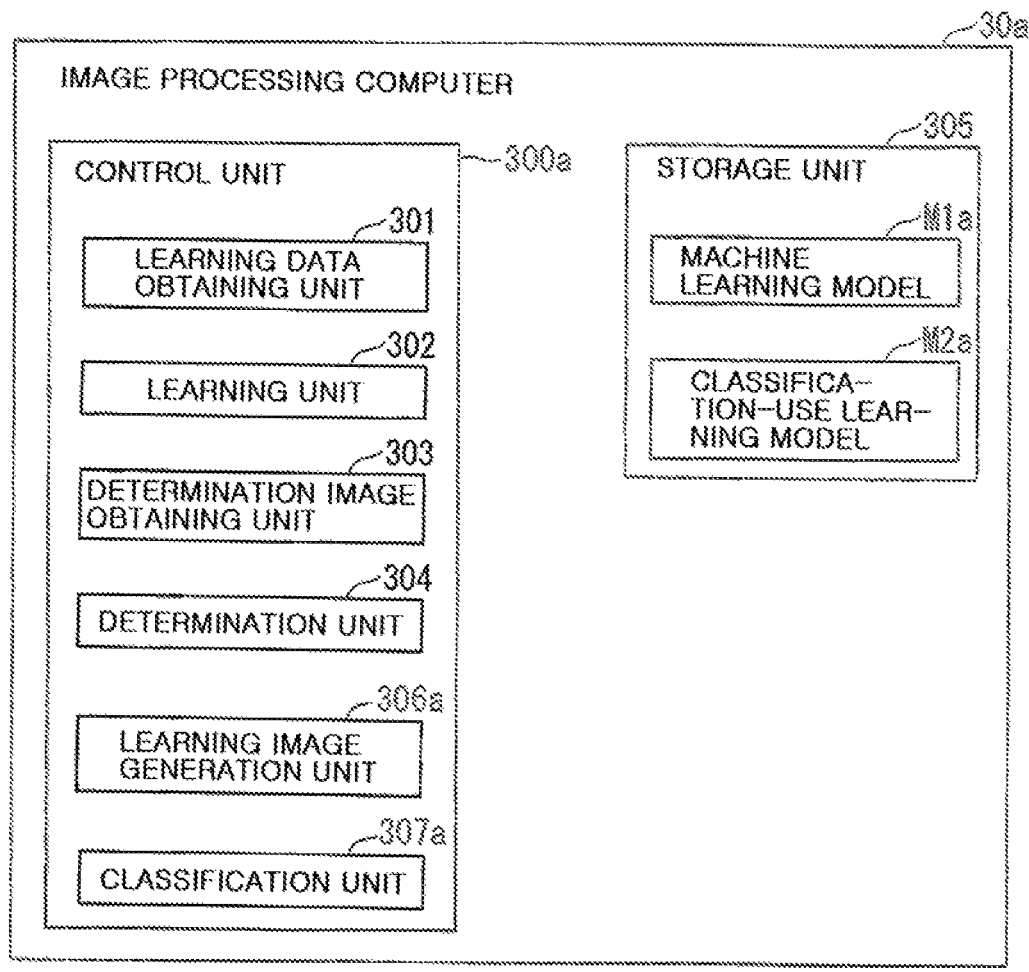
FIG. 23 is a diagram for illustrating an example of a configuration of an image processing computer in a second embodiment of the present invention.

FIG. 23 is a diagram for illustrating an example of a configuration of the image processing computer 30a in the second embodiment. When the image processing computer 30a (FIG. 23) in the second embodiment is compared with the image processing computer 30 (FIG. 6) in the first embodiment, the image processing computer 30a differs in that the image processing computer 30a includes a learning image generation unit 306a, a classification unit 307a, a machine learning model M1a, and a classification-use learning model M2a. Functions of the other components in the second embodiment are the same as those of the components in the first embodiment. Descriptions on the same functions as those in the first embodiment are omitted here, and the description of the second embodiment focuses on differences from the first embodiment.

A control unit 300a includes, in addition to the learning data obtaining unit 301, the learning unit 302, the determination image obtaining unit 303, and the determination unit 304, the learning image generation unit 306a and the classification unit 307a.

The learning image generation unit 306a generates a pseudo image PI as a learning image. In the second embodiment, the pseudo image PI is an image generated from an SIM image and an SEM image that are obtained in advance by irradiating a target with a charged particle beam. The learning image generation unit 306a generates the pseudo image PI based on, for example, bare ware BW and a pattern image PT.

The bare ware BW is an image in which a surface pattern of a target is removed to indicate the shape of the target. The bare ware BW is preferred to be a plurality of images that differ from one another in size, contrast, focus, or the like and that indicate a plurality of target shapes. The bare ware BW is an image drawn with the use of image software, unlike SIM images and SEM images.

The pattern image PT is an image that indicates a pattern corresponding to the internal structure of a target. The pattern image PT may be an SIM image or an SEM image that is obtained by irradiation with a charged particle beam, or an image drawn with the use of image software.

The learning image generation unit 306a generates the pseudo image PI with the use of a pseudo image generation algorithm, by adding a random noise to a pattern that is indicated by the pattern image PT and that corresponds to the internal structure of a target, and superimposing the pattern on the bare ware BW.

In the second embodiment, an example of a case in which the learning image generation unit 306a generates the pseudo image PI as a learning image of the sample piece Q is described, but the second embodiment is not limited thereto. The learning image generation unit 306a may generate the pseudo image PI as a learning image of the needle 18 or of the pillar-like portions 44.

The learning image generation unit 306a may include, in the learning image, the SIM image and the SEM image in the first embodiment, which are obtained in advance by irradiating the target with a charged particle beam. That is, the learning image generation unit 306a may use the pseudo image PI alone or may use the pseudo image PI in combination with the SIM image and the SEM image, as the learning image.

The learning unit 302 generates the machine learning model M1a in the machine learning by extracting, as feature amounts, the surface shape of the target and the pattern of the internal structure of the target from the learning image that has been generated by the learning image generation unit 306a.

A method of generating the pseudo image PI is described with reference to FIG. 24 to FIG. 26.

Figure 24:
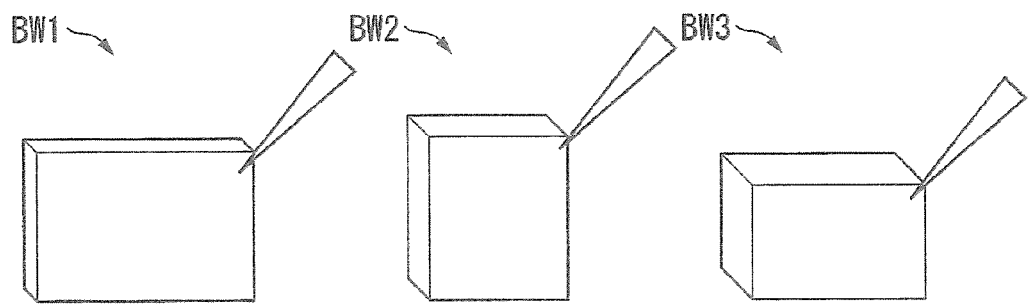
FIG. 24 is a diagram for illustrating an example of bare ware in the second embodiment of the present invention.

FIG. 24 is a diagram for illustrating an example of the bare ware BW in the second embodiment. In FIG. 24, bare ware BW1, bare ware BW2, and bare ware BW3 are illustrated as the bare ware BW of the sample piece Q. The bare ware BW1, the bare ware BW2, and the bare ware BW3 are images in which shapes of the sample piece Q in a plurality of sizes are simulated. An image corresponding to the needle 18 is included in each of the bare ware BW1, the bare ware BW2, and the bare ware BW3 as information indicating the pick-up position.

Figure 25:
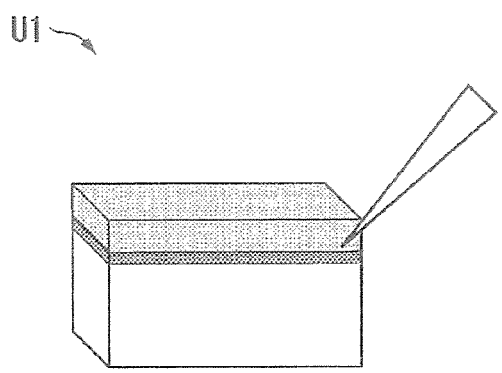
FIG. 25 is a diagram for illustrating an example of a pattern image in the second embodiment of the present invention.

FIG. 25 is a diagram for illustrating an example of the pattern image PT in the second embodiment. In FIG. 25, a user sample U1 is illustrated as the pattern image PT. The user sample U1 is an image prepared to suit the type of the sample piece Q that is intended by a user of the charged particle beam apparatus 10a to be processed. In the user sample U1, patterns corresponding to the types of materials that form a plurality of layers of a multi-layer sample piece are drawn.

Figure 26:
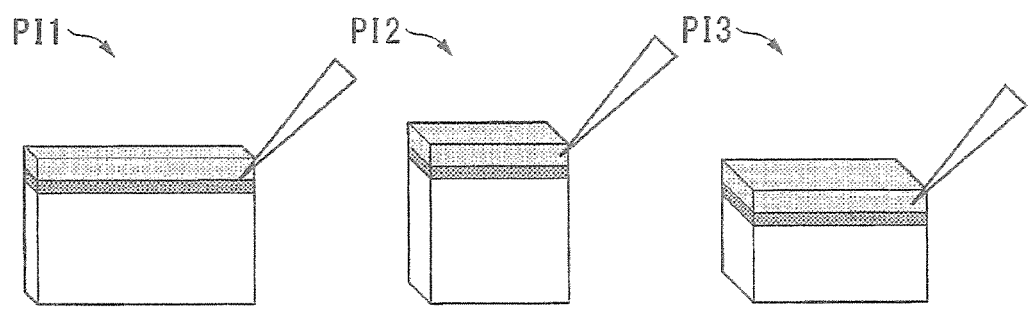
FIG. 26 is a diagram for illustrating an example of pseudo images in the second embodiment of the present invention.

FIG. 26 is a diagram for illustrating an example of the pseudo image PI in the second embodiment. In FIG. 26, a pseudo image PI1, a pseudo image PI2, and a pseudo image PI3, which are generated based on the bare ware BW1, bare ware BW2, and bare ware BW3 of FIG. 24 and on the user sample U1 of FIG. 25, are illustrated as the pseudo image PI. In the pseudo image PI1, the pseudo image PI2, and the pseudo image PI3, the internal structure pattern indicated by the user sample U1 is superimposed on the shapes of the sample piece Q of a plurality of sizes.

Referring back to FIG. 23, the description of the configuration of the image processing computer 30a is continued.

The classification unit 307a classifies a determination image obtained by the determination image obtaining unit 303, based on the classification-use learning model M2a. The classification unit 307a may not always classify a determination image. Whether the classification unit 307a classifies a determination image is set on the image processing computer 30, based on, for example, settings input to the control computer 22.

The classification-use learning model M2a is a model for selecting, from a plurality of models included in the machine learning model M1a, a model to be used for the determination by the determination unit 304 in accordance with the type of a target. The plurality of models included in the machine learning model M1a in that case are distinguished from one another by not only the set of learning data that has been used for generation of the model but also the algorithm of machine learning.

The classification-use learning model M2a associates, for example, for each user, the type of the sample piece Q to be processed, and a model included in the machine learning model M1a. The classification-use learning model M2a is generated in advance based on machine learning, and is stored in the storage unit 305.

Processing of detecting the pick-up position of the sample piece Q is described next with reference to FIG. 27, as the operation of automated MS of the charged particle beam apparatus 10a that uses the classification-use learning model M2a.

Figure 27:
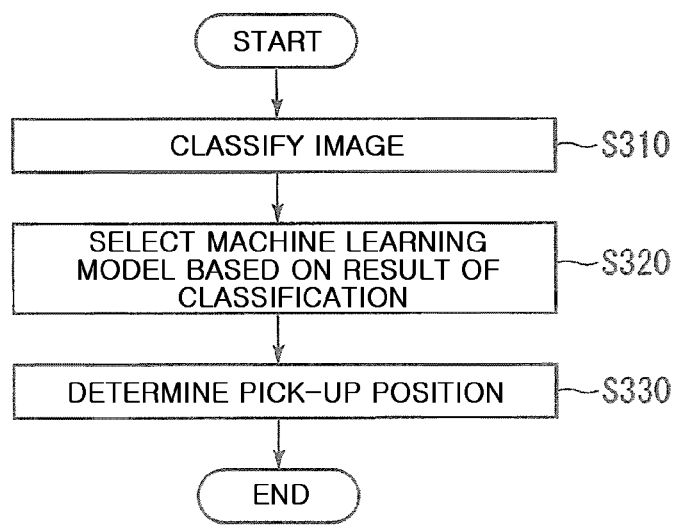
FIG. 27 is a diagram for illustrating an example of processing of detecting a pick-up position in the second embodiment of the present invention.

FIG. 27 is a diagram for illustrating an example of the processing of detecting the pick-up position in the second embodiment.

Step S310: The classification unit 307a classifies a determination image obtained by the determination image obtaining unit 303, based on the classification-use learning model M2a.

Step S320: The classification unit 307a selects, based on the result of the classification, a machine learning model to be used for the determination by the determination unit 304 from a plurality of models included in the machine learning model M1a.

Step S330: The determination unit 304 determines the position of a target that is included in the determination image obtained by the determination image obtaining unit 303, based on the machine learning model selected by the classification unit 307a.

The embodiments described above deal with an example of a case in which the charged particle beam apparatus 10 or 10a includes two charged particle beam irradiation optical systems, namely, the focused ion beam irradiation optical system 14 and the electron beam irradiation optical system 15. However, the present invention is not limited thereto. The charged particle beam apparatus may include one charged particle beam irradiation optical system. In that case, a determination image obtained by irradiation with a charged particle beam from the charged particle beam irradiation optical system is preferred to include, for example, a shadow of a target in addition to the target. The target in this case is the needle 18.

The shadow of the needle 18 is a phenomenon that occurs when the needle 18 approaches a surface of the sample piece Q in observation from a tilt direction with the tilt of a predetermined angle with respect to the vertical direction of the sample stage 12, because the approaching needle 18 blocks the arrival of secondary electrons (or secondary ions) generated from a part of the surface of the sample piece Q that is close to the needle 18 at the detector 16. The phenomenon is more prominent when the distance between the needle 18 and the surface of the sample piece Q is closer. The shadow in the determination image accordingly has a higher luminance value when the distance between the needle 18 and the surface of the sample piece Q is closer.

The image processing computer 30 performs calculation of the distance between the tip of the needle 18 and the surface of the sample piece Q based on the luminance value of the shadow of the needle 18 in addition to the determination in which, from the determination image, the position of the tip of the needle 18 is determined in the form of two-dimensional coordinates in the determination image. The image processing computer 30 thus determines, from the determination image, the position of the tip of the needle 18 in the form of values of three-dimensional coordinates.

In the embodiments described above, the control computer 22 may generate the absorption current image data by setting a scanning speed to a second speed slower than a first speed, and the image processing computer 30 may set a resolution of the image included in the absorption current image data generated by setting the scanning speed to the second speed to a second resolution higher than a first resolution and the image processing computer 30 may then determine the position of the target based on the machine learning model M.

Here, the "scanning speed" refers to a speed at which the control computer 22 scans the irradiation position of the charged particle beam in the process of generating the absorption current image data by the control computer 22. The "first speed" refers to, for example, a speed at which the related-art charged particle beam apparatus scans the irradiation position of the charged particle beam. The "second speed" is any arbitrary speed slower than the first speed. The second speed is, for example, a scanning speed that has been selected in the related-art charged particle beam apparatus to obtain a high-resolution image in order to increase a success rate of the template matching.

The "resolution" refers to a density of pixels forming an image. The "first resolution" refers to, for example, a resolution of each of an SIM image and an SEM image included in absorption current image data generated by the related-art charged particle beam apparatus. The "second resolution" refers to any arbitrary resolution having a spatial frequency higher than that of the first resolution.

In the following description, setting the scanning speed to the second speed is also referred to as, for example, "lowering the scanning speed". Further, converting the resolution of the image from the first resolution to the second resolution is also referred to as, for example, "enhancing the resolution of the image".

Description is now given of processing executed by the image processing computer 30 when the control computer 22 generates the absorption current image data by lowering the scanning speed, and the image processing computer 30 enhances the resolution of each of an SIM image and an SEM image included in the absorption current image data generated by lowering the scanning speed, and the image processing computer 30 then determines the position of the target based on the machine learning model M. This processing is executed in, for example, Step S20 illustrated in FIG. 7, Step S520 illustrated in FIG. 14, and Step S110 illustrated in FIG. 22, which are described above.

The determination image obtaining unit 303 obtains the SIM image or the SEM image from the image processing computer 30 as the determination image. The SIM image and the SEM image are images included in the absorption current image data generated by the control computer 22 by lowering the scanning speed. The determination unit 304 executes processing of enhancing the resolution of the determination image obtained by the determination image obtaining unit 303. Any super-resolution technology may be used for a super-resolution technology to be used by the determination unit 304 to enhance the resolution of the image, and there is no limitation on the super-resolution technology. The determination unit 304 converts, for example, the resolution of each of the SIM image and the SEM image from the first resolution to the second resolution. In this case, the determination unit 304 not only converts the resolution of each of the SIM image and the SEM image, but also executes processing of increasing a spatial frequency of the image of the target included in each of the SIM image and the SEM image to a spatial frequency higher than that of the image before conversion.

The determination unit 304 determines, based on the machine learning model M, a position of the target included in the determination image having the enhanced resolution. The determination unit 304 outputs position information indicating the determined position of the target to the control computer 22.

As described above, in the case where the control computer 22 generates the absorption current image data by setting the scanning speed to the second speed slower than the first speed, and the image processing computer 30 sets the resolution of the image included in the absorption current image data generated by setting the scanning speed to the second speed to the second resolution higher than the first resolution, and the image processing computer 30 then determines the position of the target based on the machine learning model M, when the scanning speed is set to the second speed, it is possible to shorten a processing time period required for the processing of determining the position of the target and to enhance the precision of the determination as compared with a case in which the resolution of the image is not set to the second resolution.

When the image processing computer 30 enhances the resolution of the absorption current image data obtained by setting the scanning speed to the second speed and then determines the position of the target based on the machine learning model M, and consequently fails to determine the position of the target, the control computer 22 may obtain the absorption current image data by setting the scanning speed to the first speed, and the image processing computer 30 may determine the position of the target based on the machine learning model M without enhancing the resolution of the image data. When a cause of the failure to determine the position of the target is insufficiency of the enhancement of the resolution of the image data, the position of the target may be accurately detected by executing retry processing with the use of the absorption current image data obtained by setting the scanning speed to the first speed.

The control computer 22 and some components of the image processing computer 30 or 30a, for example, the learning data obtaining unit 301, the learning unit 302, the determination image obtaining unit 303, the determination unit 304, the learning image generation unit 306a, and the classification unit 307a, in the embodiments described above may be implemented by a computer. In that case, a control function thereof may be implemented by recording a program for implementing the control function in a computer-readable recording medium, and reading and executing the program that is recorded in the recording medium on a computer system. The "computer system" used herein is a computer system built in the control computer 22 or the image processing computer 30 or 30a, and includes an OS as well as peripheral devices and other types of hardware. The "computer-readable recording medium" refers to a portable medium, for example, a flexible disk, a magneto-optical disc, a ROM, or a CD-ROM, or a storage device built in the computer system, for example, a hard disk. Examples of the "computer-readable recording medium" may also include an element configured to dynamically hold the program for a short time, as in a communication line used when the program is transmitted via the Internet or other networks or a phone line or other communication links, and an element configured to hold the program for a fixed length of time, as in a volatile memory inside a computer system that serves as a server or a client in that case. The program described above may be designed so that only some of the described functions are implemented by the program, or so that the program is combined with another program already recorded in the computer system to implement the described functions.

The control computer 22 and some or all of the components of the image processing computer 30 or 30a in the embodiments described above may be implemented as a large scale integration (LSI) circuit or a similar integrated circuit. The control computer 22 and the function blocks of the image processing computer 30 or 30a may be configured as individual processors, or some or all thereof may be integrated to be configured as one processor. An integrated circuit to be used for the implementation is not limited to LSI, and a dedicated circuit or a general-purpose processor may be used. When a technology for integration into an integrated circuit that substitutes for LSI appears due to advancement in semiconductor technology, an integrated circuit obtained by this technology may be used.

While a detailed description has been given above on at least one embodiment of the present invention with reference to the drawings, the concrete configuration of the present invention is not limited to the ones described above, and various design modifications and the like can be made without departing from the spirit of the present invention.

What is claimed is:

1. A charged particle beam apparatus, which is configured to automatically fabricate a sample piece from a sample, the charged particle beam apparatus comprising:
   a charged particle beam irradiation optical system configured to radiate a charged particle beam;
   a sample stage configured to move the sample that is placed on the sample stage;
   a sample piece transportation unit configured to hold and convey the sample piece separated and extracted from the sample;
   a holder fixing base configured to hold a sample piece holder to which the sample piece is transported; and
   a computer configured to perform position control with respect to a second target, based on a machine learning model in which first information including a first image of a first target is learned, and on second information including a second image, which is obtained by irradiation with the charged particle beam.

2. The charged particle beam apparatus according to claim 1, wherein the second target includes a part of a sample table included in the sample piece holder.

3. The charged particle beam apparatus according to claim 1, wherein the second target includes a needle to be used in the sample piece transportation unit.

4. The charged particle beam apparatus according to claim 2, wherein the second target includes a needle to be used in the sample piece transportation unit.

5. The charged particle beam apparatus according to claim 1,
   wherein the second target includes the sample piece, and
   wherein the first image is an image indicating a position at which the sample piece transportation unit is to be brought close to the sample piece in a sample extraction step of extracting the sample piece.

6. The charged particle beam apparatus according to claim 1,
   wherein the second target includes the sample piece, and
   wherein the first image is an image indicating a position at which the sample piece is to be separated and extracted from the sample.

7. The charged particle beam apparatus according to claim 1, wherein the first image is a pseudo image generated to suit a type of the second target, wherein the type of the second target is a sample piece, a needle, or an object to which the sample is transported.

8. The charged particle beam apparatus according to claim 1, wherein the first target and the second target are of a same type, wherein the same type of the first target and the second target is a sample piece, a needle, or an object to which the sample is transported.

* * * * *